(12) United States Patent
Nago et al.

(10) Patent No.: US 7,863,637 B2
(45) Date of Patent: Jan. 4, 2011

(54) SEMICONDUCTOR LIGHT EMITTING ELEMENT, METHOD FOR MANUFACTURING THE SAME, AND LIGHT EMITTING DEVICE

(75) Inventors: Hajime Nago, Yokohama (JP); Koichi Tachibana, Kawasaki (JP); Kotaro Zaima, Tokyo (JP); Shinji Saito, Yokohama (JP); Shinya Nunoue, Ichikawa (JP); Toshiyuki Oka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 458 days.

(21) Appl. No.: 12/037,358

(22) Filed: Feb. 26, 2008

(65) Prior Publication Data

US 2008/0237569 A1 Oct. 2, 2008

(30) Foreign Application Priority Data

Mar. 26, 2007 (JP) .............................. 2007-078719

(51) Int. Cl.
*H01L 33/00* (2010.01)
(52) U.S. Cl. ........................... 257/98; 257/99; 257/104; 257/E33.059; 257/E33.005
(58) Field of Classification Search .................... 257/94, 257/98, 99, 103, E33.005, E33.023, E33.049, 257/E33.059
See application file for complete search history.

(56) References Cited

U.S. PATENT DOCUMENTS

| | | | |
|---|---|---|---|
| 2004/0048471 A1* | 3/2004 | Okagawa et al. ............ 438/689 |
| 2004/0113166 A1* | 6/2004 | Tadatomo et al. ............. 257/98 |
| 2004/0206299 A1* | 10/2004 | Tadatomo et al. ............. 117/84 |
| 2006/0043399 A1* | 3/2006 | Miyagaki et al. .............. 257/98 |
| 2006/0043419 A1 | 3/2006 | Tachibana et al. |
| 2007/0026643 A1* | 2/2007 | Tadatomo et al. ........... 438/478 |
| 2007/0026644 A1* | 2/2007 | Tadatomo et al. ........... 438/478 |
| 2008/0048194 A1* | 2/2008 | Kudo et al. .................... 257/94 |
| 2008/0135868 A1* | 6/2008 | Okagawa et al. .............. 257/99 |

FOREIGN PATENT DOCUMENTS

JP 2003-258302 9/2003

\* cited by examiner

*Primary Examiner*—Zandra Smith
*Assistant Examiner*—Telly D Green
(74) *Attorney, Agent, or Firm*—Oblon, Spivak, McClelland, Maier & Neustadt, L.L.P.

(57) ABSTRACT

The present invention provides a semiconductor light emitting element with excellent color rendering properties, a method for manufacturing the semiconductor light emitting element, and a light emitting device. The semiconductor light emitting element includes: a semiconductor substrate that has a convex portion having a tilted surface as an upper face, and a concave portion formed on either side of the convex portion, the concave portion having a smaller width than the convex portion, a bottom face of the concave portion being located in a deeper position than the upper face of the convex portion; and a light emitting layer that is made of a nitride-based semiconductor and is formed on the semiconductor substrate so as to cover at least the convex portion.

9 Claims, 11 Drawing Sheets

SEMICONDUCTOR LIGHT EMITTING ELEMENT, METHOD FOR MANUFACTURING THE SAME, AND LIGHT EMITTING DEVICE

CROSS-REFERENCE TO RELATED APPLICATION

This application is based upon and claims the benefit of priority from prior Japanese Patent Application No. 2007-78719 filed on Mar. 26, 2007 in Japan, the entire contents of which are incorporated herein by reference.

BACKGROUND OF THE INVENTION

1. Field of the Invention

The present invention relates to a semiconductor light emitting element, a method for manufacturing the semiconductor light emitting element, and a light emitting device.

2. Related Art

In recent years, semiconductor light emitting elements are widely used for display devices, lighting systems, recording devices, and the likes. Particularly, semiconductor light emitting diodes (LEDs) that do not involve induced emission are used as display devices, because of its high luminance. Also, as one of the latest applications, LEDs are used as lights. For instance, as alternative lights for fluorescent lights, solid-state illumination has been developed and is being actively put into practical use by combining fluorescent lights with semiconductor light emitting elements of short wavelengths in the range of green and ultraviolet that include nitride-based semiconductors such as GaN. To actually replace the conventional solid-state illumination with the alternative lights, it is important to optimize the combination of a light emitting element such as a light emitting diode (LED) including a nitride-based semiconductor and a fluorescent material, and to obtain natural white light very similar to the sunlight.

There have been combinations of blue LEDs and yellow fluorescent materials to obtain general white light. However, a combination of a near-ultraviolet LED chip and a RGB fluorescent material can obtain the light most similar to the sunlight, and can also achieve more excellent color rendering properties than any combination of a blue LED and a yellow fluorescent material.

However, by such a related technique, it is necessary to apply a fluorescent material to a LED chip, and the color rendering properties are affected by the application method. Therefore, a complicated manufacturing process and fine adjustment are required. Also, there is the problem that it is difficult to obtain uniform reproducibility and to readily obtain a white light source.

Further, there is the problem that an increase in In (indium) composition ratio for controlling the wavelength of the LED chip combined with a fluorescent material leads to an increase of defects in non-light emitting portions due to uneven concentration and a decrease in crystal quality. Therefore, it has been difficult to obtain high-quality crystals with high In composition ratios.

Also, there is the problem that the light emission efficiency with respect to the power input of a semiconductor light emitting element used as a light is lower than the light emission efficiency of a fluorescent light.

Meanwhile, GaN-based semiconductor light emitting elements that can emit high-power ultraviolet rays even with a low In composition ratio have been developed (see JP-A 2003-258302 (KOKAI), for example). The light emitting element disclosed in JP-A 2003-258302 (KOKAI) has a stacked structure formed with GaN-based crystalline layers on a substrate having concave and convex portions on its surface, and the stacked structure includes an InGaN-based light emitting layer. The In composition in the light emitting layer is modulated in the plane in accordance with the concave and convex portions of the substrate. However, the light emission wavelength range of this light emitting element is not wide, and color rendering properties that are close to those of white light cannot be obtained.

As described above, the related combination of a light emitting element and a fluorescent material to obtain white light involves a complicated manufacturing process, and a highly controlled manufacturing technique is required to form a light emitting element having a high In composition ratio for wavelength control.

Also, there have been no semiconductor light emitting elements with excellent color rendering properties.

SUMMARY OF THE INVENTION

The present invention has been made in view of these circumstances, and an object hereof is to provide a semiconductor light emitting element with excellent color rendering properties, a method for manufacturing such a semiconductor light emitting element, and a light emitting device.

A semiconductor light emitting element according to a first aspect of the present invention includes: a semiconductor substrate that has a convex portion having a tilted surface as an upper face, and a concave portion formed on either side of the convex portion, the concave portion having a smaller width than the convex portion, a bottom face of the concave portion being located in a deeper position than the upper face of the convex portion; and a light emitting layer that is made of a nitride-based semiconductor and is formed on the semiconductor substrate so as to cover at least the convex portion.

A semiconductor light emitting element according to a second aspect of the present invention includes: a semiconductor substrate; an n-type GaN layer that is provided on the semiconductor substrate; a light emitting layer that is provided on the n-type GaN layer and has a multiquantum well structure having barrier layers and well layers alternately stacked; and a contact layer that is provided on the light emitting layer and is made of p-type GaN, a mean refractive index of the barrier layers and the well layers being lower than a mean refractive index of the layers existing on and under the light emitting layer.

A semiconductor light emitting device according to a third aspect of the present invention includes: a support member; a semiconductor light emitting element according to claim 1 that is supported by the support member; a resin material that is formed to cover at least part of the semiconductor light emitting element; and a fluorescent material that is diffused in the resin material, absorbs at least part of light emitted from the semiconductor light emitting element, wavelength-converts the absorbed light, and emits the wavelength-converted light.

A method for manufacturing a semiconductor light emitting element according to a fourth aspect of the present invention includes: forming a light emitting layer formed with a nitride-based semiconductor on a semiconductor substrate that has a convex portion having a tilted surface as an upper face, and a concave portion formed on either side of the convex portion, the concave portion having a smaller width than the convex portion, a bottom face of the concave portion being located in a deeper position than the upper face of the convex portion.

DESCRIPTION OF THE EMBODIMENTS

The following is a description of embodiments of the present invention, with reference to the accompanying drawings.

First Embodiment

Figure 1:
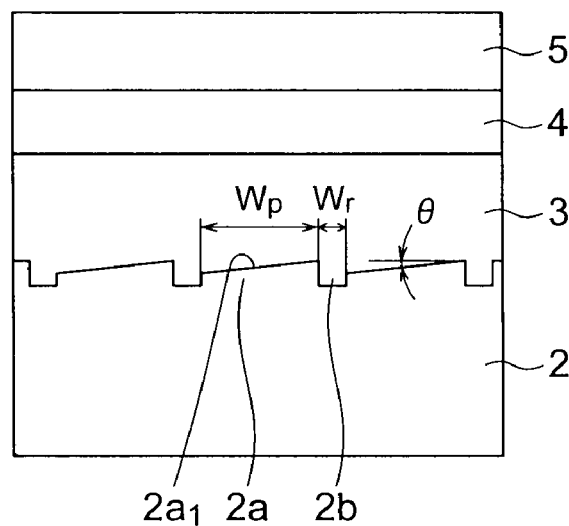
FIG. 1 is a cross-sectional view schematically showing the structure of a semiconductor light emitting element according to a first embodiment.
Figure 1:
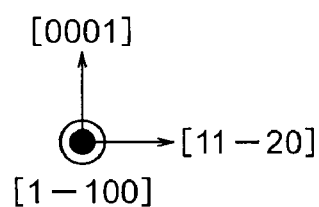

FIG. 1 is a schematic cross-sectional view of a nitride-based semiconductor light emitting element in accordance with a first embodiment of the present invention. The semiconductor light emitting element of this embodiment includes a guide layer 3 formed with n-type GaN on a substrate 2 having thereon convex portions 2a and concave portions 2b with different widths from each other, a light emitting layer 4 having a multiquantum well structure formed with InGaN on the GaN layer 3, and a guide layer 5 formed with p-type GaN on the light emitting layer 4. In this embodiment, a contact layer and an electrode are omitted. Each of the layers is grown in the <0001> direction (upward in the drawing).

The convex portions 2a and the concave portions 2b of the substrate 2 exist in the form of stripes extending in the <1-100> direction (a direction perpendicular to the paper surface of FIG. 1). The width $w_p$ of each convex portion 2a is greater than the width $w_r$ of each concave portion 2b, with the width $w_p$ of each convex portion 2a being 400 μm, and the width $w_r$ of each concave portion 2b being 30 μm. The width $w_p$ of each convex portion 2a should be in the range of 200 μm to 1 mm. If the width $w_p$ of each convex portion 2a is smaller than 200 μm, the light emitting region becomes narrower, and the light emission efficiency per chip becomes lower accordingly. If the width $w_p$ of each convex portion 2a is greater than 1 mm, the in-plane unevenness of the In composition in the stacked light emitting layer 4 becomes more prominent, and excellent color rendering properties cannot be achieved. More preferably, the width $w_p$ of each convex portion 2a should be in the range of 300 μm to 500 μm.

The width $w_r$ of each concave portion 2b should be in the range of 20 μm to 100 μm. If the width $w_r$ of each convex portion 2b is smaller than 20 μm, the growth faces of the convex portions 2a adjacent to each concave portion 2b might meet each other, and stacked atoms and molecules might freely migrate between the convex portions 2a. As a result, an In composition distribution with excellent color rendering properties cannot be maintained. If the width $w_r$ of each concave portion 2b is greater than 100 μm, the number of nitride-based semiconductor light emitting elements that can be produced from one wafer becomes smaller, which is not preferred. More preferably, the width $w_r$ of each concave portion 2b should be in the range of 20 μm to 50 μm.

The depth of each concave portion 2b, which is the distance from the lowest end of the tilted face of each concave portion 2a, is preferably in the range of 5 μm to 50 μm. By forming concave portions of 5 μm or greater in depth to serve as starting points of the scribe lines to be used for cutting out chips after crystal growth, it becomes easier to divide the wafer and cut out the chips. However, if the depth is greater than 50 μm, the thickness of the wafer at each concave portion becomes smaller, and the strength is reduced. Accordingly, at the time of the formation of the scribe lines to be used for dividing the wafer into chips with desired shapes, the wafer breaks along the concave portions at which the dividing is not to be performed, and the chips of the desired size cannot be obtained, resulting in a decrease in productivity.

In this embodiment, each of the convex portions 2a has a tilted surface 2a1 that is tilted with respect to the <11-20> direction (from the right-hand side to the left-hand side in the paper space), and the tilt angle θ of the tilted surface 2a1 with respect to the film plane is approximately 0.3 degrees. The tilting direction may be either rightward or leftward. Also, one substrate 2 may have convex portions 2a with different tilting directions. Also, one substrate 2 may have convex and concave portions with various widths, depths, and cycles. The tilt angle θ may be in the range of 0.1 to 45 degrees. However, to form a device structure, the tilt angle θ is preferably in the range of 0.1 to 5 degrees. To obtain an In composition distribution with excellent color rendering properties and maintain flatness, the tilt angle θ is more preferably in the range of 0.2 to 0.4 degrees.

Light emitting elements are produced by epitaxially growing a nitride-based semiconductor thin film on the substrate 2 having the convex portions 2a and the concave portions 2b formed thereon. The thin film may be grown by a well-known technique such as metal organic chemical vapor deposition (MOCVD) or molecular beam epitaxy (MBE).

Figure 2:
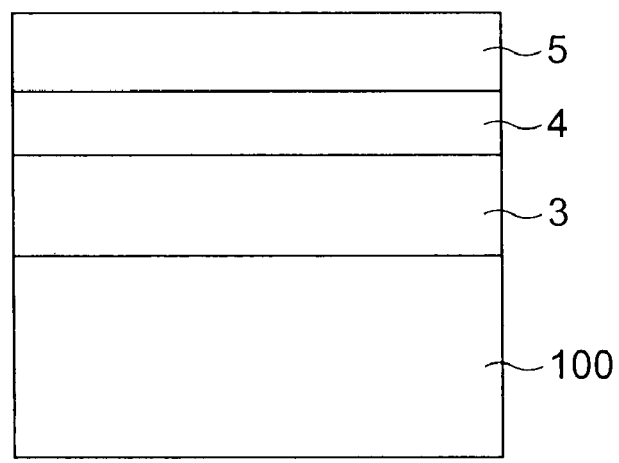
FIG. 2 is a cross-sectional view showing a semiconductor light emitting element of a comparative example.

As a comparative example as opposed to this embodiment, a light emitting element that includes a guide layer 3 formed with n-type GaN on a substrate 100 having no concave and convex portions, a light emitting layer 4 formed with InGaN having a multiquantum well structure, and a guide layer 5 formed with p-type GaN is produced as shown in FIG. 2. The growing direction of each layer is the <0001> direction, which is the same as the growing direction in this embodiment.

The wavelength peaks of a light emitting element and the light emitting element of the comparative example were measured by microscope photoluminescence (PL). In the case of the light emitting element of the comparative example, the wavelengths within the 400 μm angle were substantially uniform. In the case of the light emitting element of this embodiment, on the other hand, the wavelengths varied within the range of ±20 nm to ±30 nm. Also, it was found that, when the measurement point was at a lower point on the tilted surface of the convex portion 2a, the measured wavelength is shorter. This is explained below in greater detail.

During the InGaN crystal growth, In atoms (or molecules) move about or migrate on the C plane {0001}, which is the growth face. Here, if there is no Ga existing in the place taking those atoms in, such as the step ends of an atom layer or at a kink shifted from the straight line of the step of the atom layer by one or several atoms, the In atoms are not taken in, but evaporate or diffuse. Therefore, it is necessary to create a situation in which a large amount of Ga exists at the atom layer step ends or the kink, or on the migrating surface layer. In other words, the amount of In to be taken in is larger, as the growth speed is higher. In a case where there is a tilt with respect to the <11-20> direction, the abundance ratio between the Ga plane and the N plane on the surface layer vary in accordance with the tilt angle. Therefore, the growth speed on the absorption plane on the surface layer varies, and the amount of In atoms to be taken in varies accordingly. A variation in In composition distribution is then formed in the same plane in stacked thin films.

In the case of this embodiment, the abundance ratio of the Ga plane tends to become lower toward the lower side of the tilted surface 2a1 of each convex portion 2a. Accordingly, it is considered that a region in which a large amount of In is to be taken in is formed at a high portion of the tilted surface 2a1, and a variation in wavelength is caused within the tilted surface. In a case of step-flow growth, the growth progresses in the direction of the tilt angle. Accordingly, in this embodiment, the growth in the direction of the tilted surface is dominant.

In this embodiment, the growth in the direction of a tilt with respect to the <11-20> direction is actively facilitated, and a difference in growth speed is caused, so that a difference in In composition distribution is formed within the plane due to the synergetic effect. In this manner, a light emitting element having a broad light emitting wavelength region, instead of a single wavelength, can be formed. Accordingly, a semiconductor light emitting element with excellent color rendering properties can be produced without a highly controlled manufacturing technique.

Instead of an increase in In composition ratio caused by forcibly increasing the growth speed, an active layer with a high In composition ratio can be obtained without surface roughness and point defects and an increase in impurities that do not contribute to light emission. Accordingly, a long-wave light emitting element with high crystal quality can be obtained, and it becomes possible to cope with LDs that require long device lives and high reliability.

In this embodiment, the main growth face direction of the nitride-based semiconductor layer is the C plane {0001}. However, it is not limited to the C plane, and may be some other plane, such as the A plane {11-20}, the R plane {1-102}, the M plane {1-100}, the {1-101} plane, or the {11-22} plane.

Here, the {0001} plane is a comprehensive representation of a Miller's index, including equivalent planes such as the (0001) plane and the (000-1) plane. The <1-100> direction is a Miller's index collectively representing the group of directions, including the [1-100], [10-10], [-1100], [-1010], [01-10], and [0-110] directions that are equivalent to one another in terms of crystallographically on the basis of symmetric properties of the hexagonal system. The <11-20> direction is a Miller's index collectively representing the group of directions, including the [11-20], [1-210], [-2110], [-1-120], [-12-10], and [2-1-10] directions. The [1-100] direction is a unique direction distinguished from the [10-10] direction that is rotationally symmetric to the [1-100] direction. The [11-20] is a Miller's index representing the unique direction distinguished from the [-12-10] direction and the [2-1-10] direction that are rotationally symmetric to the [11-20] direction. Each symbol "-" (bar) attached to a plane direction and a direction accompanies the number that follows the symbol.

In this embodiment, GaN is used for the substrate, but sapphire, SiC, or ZnO may be used instead.

Second Embodiment

Figure 3:
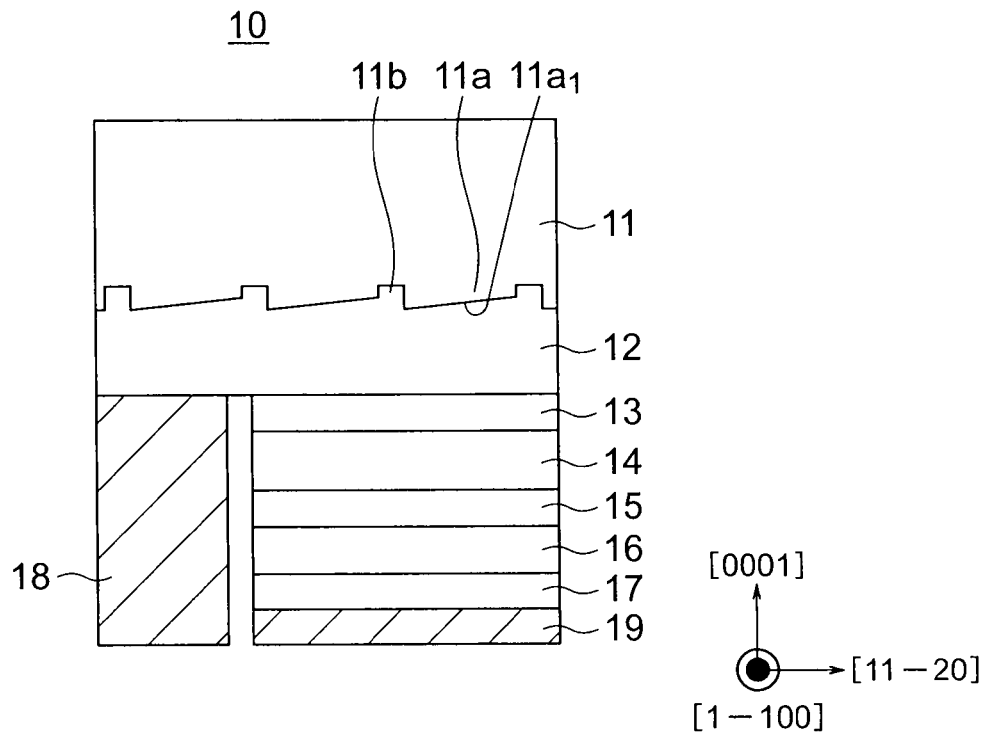
FIG. 3 is a cross-sectional view showing a semiconductor light emitting diode according to a second embodiment.

FIG. 3 shows a nitride-based semiconductor light emitting diode (LED) in accordance with a second embodiment of the present invention.

The LED of this embodiment has a stacked structure formed on a substrate 11 that is made of n-type GaN and has the same convex portions 11a and concave portions 11b as those of the first embodiment. The stacked structure includes a contact layer 12 made of n-type GaN, a guide layer 13 made of n-type GaN, a light emitting layer 14 made of InGaN having a multiquantum well structure, an overflow preventing layer 15 made of p-type AlGaN, a guide layer 16 made of p-type GaN, and a contact layer 17 made of p-type GaN. Those layers are stacked in this order. As in the case of the first embodiment, the surface of each convex portion 11a is a tilted surface 11a1 tilted with respect to the <11-20> direction (from the right-hand side to the left-hand side in the paper space). The widths of the convex portions 11a and the concave portions 11b are within the ranges described in the first embodiment. In this embodiment, the width of each convex portion 11a is 400 μm, and the width of each concave portion 11b is 30 μm.

A part of the stacked structure is removed, starting from the contact layer 17 made of p-type GaN to the contact layer 12 made of n-type GaN. An n-side electrode 18 formed with Ti/Pt/Au is formed on the exposed contact layer 12. Also, a p-side reflection electrode 19 made of Ag is formed on the surface of the contact layer 17 made of p-type GaN. The p-side reflection electrode 19 reflects light emitted from the light emitting layer 14, and increases the light retrieving efficiency.

Next, the method for manufacturing the LED of this embodiment is described. The LED of this embodiment was manufactured by the well-known metal organic chemical vapor deposition (MOCVD) method. Trimethylgallium (TMG), trimethylaluminum (TMA), trimethylindium (TMI), and bis-cyclopentadienyl magnesium ($Cp_2Mg$) were used, and ammonia (NH$_3$) and silane (SiH$_4$) were used as raw material gases. Further, hydrogen and nitrogen were used as carrier gases. By the method for manufacturing the LED of this embodiment, the manufacturing device and the raw materials are not limited to those described below.

First, the substrate 11 made of n-type GaN having the convex portions 11a and the concave portions 11b formed on the surface was subjected to organic cleaning and acid cleaning, and was placed in the reaction chamber of a MOCVD device. The substrate 11 was then placed on a susceptor that was heated by high frequency waves. At normal pressures, nitrogen was introduced at a flow rate of 41 L (liters)/min, and ammonia was introduced at a flow rate of 4 L/min. Vapor phase etching was then performed while the temperature rose to 1100° C. in 12 minutes, and the natural oxide film formed on the surface of the substrate 11 was removed.

The contact layer 12 made of n-type GaN was then formed by supplying the carrier gases for 60 minutes: hydrogen at a flow rate of 6 L/min, nitrogen at a flow rate of 18 L/min, ammonia at a flow rate of 6 L/min, TMG at a flow rate of 50 cc/min, and SiH$_4$ at a flow rate of 10 cc/min.

The temperature was then reduced to 1060° C., and the SiH$_4$ flow rate was lowered to 3 cc/min. The guide layer 13 made of n-type GaN was grown in approximately 3 minutes.

The supply of TMG and SiH$_4$ was then stopped, and the temperature of the substrate 11 was lowered to 800° C. The carrier gas was limited only to nitrogen at a flow rate of 27 L/min. Ammonia was then introduced at a flow rate of 12 L/min, and TMG was introduced at a flow rate of 3 cc/min. Also, TMI was supplied at a flow rate of 5 cc/min and a flow rate of 120 cc/min. The former flow rate lasted for approximately 16 minutes, and the latter flow rate lasted for approximately 0.5 minutes. The two flow rates were repeatedly switched, so that each of the two flow rates was used five times. TMI was then supplied at a flow rate of 5 cc/min for approximately 110 minutes, so as to form the light emitting layer 14 made of InGaN having a multiquantum well structure.

The supply of TMG and TMI was then stopped, and the nitrogen and ammonia were heated to 1030° C.

The temperature was maintained at 1030° C. The flow rate of hydrogen was switched to 21 L/min, the flow rate of nitrogen was switched to 20 L/min, and the flow rate of ammonia was switched to 4 L/min. Also, TMG was supplied at a flow rate of 25 cc/min, TMA was supplied at a flow rate of approximately 30 cc/min, and Cp$_2$Mg was supplied at a flow rate of 6 cc/min for approximately one minute, so as to form the overflow preventing layer 15 made of p-type AlGaN.

Only the supply of TMA was then stopped, and the flow rate of Cp$_2$Mg was switched to 8 cc/min. The supply of Cp$_2$Mg was then continued for approximately 6 minutes, so as to form the guide layer 16 made of p-type GaN.

In this situation, Cp$_2$Mg was supplied at a flow rate of 50 cc/min for approximately three minutes, so as to form the contact layer 17 made of p-type GaN. The supply of the organic metal material was then stopped, and only the supply of the carrier gas was continued, so that the temperature of the substrate 11 naturally dropped. The supply of ammonia was stopped when the temperature of the substrate 11 dropped to 500° C.

A part of the stacked structure was then removed by dry etching, until the removing reached the contact layer 12 made of n-type GaN. The n-side electrode 18 formed with Ti/Pt/Au was formed on the exposed contact layer 12. The p-side electrode 19 made of Ag was formed on the contact layer 17 made of p-type GaN. The stacked structure was then flipped upside down, so as to have a flip-chip structure.

The I-V characteristics of the LED of this embodiment formed in the above manner were measured to obtain excellent ohmic contact. The operating voltage of this LED was 3.5 V to 4 V with 20 mA, and the optical output was 30 mW. Also, the wavelength measurement was carried out to find that the wavelength center was 460 nm, and peaks were obtained in a ±30-nm broad wavelength region. This is because there was more than one wavelength peaks due to the difference in position, and the wavelength peaks were obtained as a result of the combination.

As described above, in accordance with this embodiment, a highly controlled manufacturing technique is not required, and light emitting elements having a broad wavelength region width of 60 nm to 80 nm with respect to the center wavelength can be obtained. Accordingly, it is possible to obtain a LED that has different wavelength regions in the same plane, instead of a single wavelength in the same plane, and has excellent color rendering properties.

Although GaN is used for the substrate in this embodiment, it is also possible to use sapphire, SiC, or ZnO. In this embodiment, positive and negative electrodes are provided on the same plane side, but it is possible to provide one of the two electrodes in an upper position and the other in a lower position.

Third Embodiment

Figure 4:
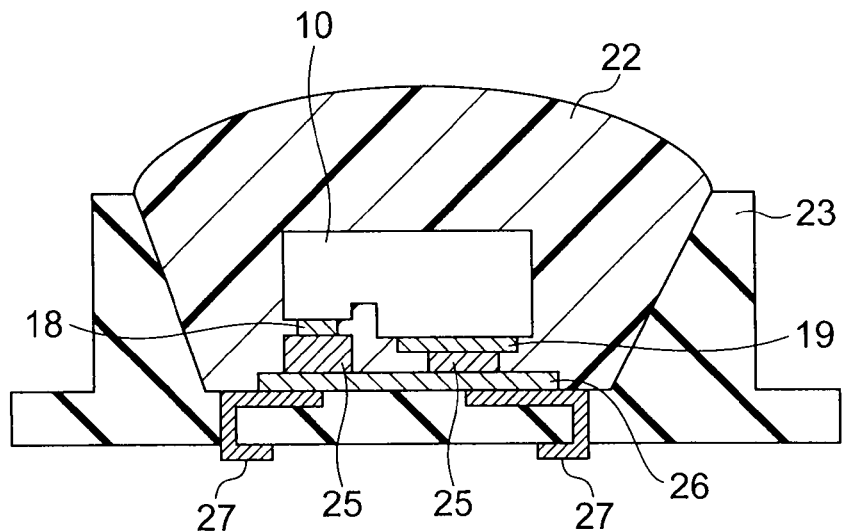
FIG. 4 is a cross-sectional view of a light emitting device according to a third embodiment.

FIG. 4 shows a light emitting device in accordance with a third embodiment of the present invention. The light emitting device of this embodiment has a structure in which the light emitting element 10 of the second embodiment is flip-chip mounted on a sub-mount 26 placed in a ceramic package (an outer housing) 23, and is sealed with resin 22 having a red fluorescent material diffused therein in order to obtain white light with more excellent rendering properties. In the light emitting device of this embodiment, the sub-mount 26 is formed on lead electrodes 27 designed to penetrate the bottom of a concave portion of the ceramic package 23. A pair of bumps 25 are formed on the sub-mount 26, and the light emitting element 10 is flip-chip mounted so that the pair of electrodes 18 and 19 of the light emitting element 10 of the second embodiment are connected to the pair of bumps 25. The bumps 25 are metal bumps or solder bumps, but gold bumps are preferred. The bumps 25 and the lead electrodes 27 are joined by conductive wires such as gold wires penetrating through the inside of the sub-mount 26, so as to establish electric conductivity. The lead electrodes 27 are required to have high electric conductivity. The material of the lead electrodes 27 may be iron, copper, or a copper alloy, or iron, copper, or a copper alloy plated with a metal such as silver, aluminum or gold.

The ceramic package 23 and the light emitting element 10 are hermetically sealed with the sealing resin 22 made of silicone resin. The sealing resin 22 is not limited to silicone resin. For example, epoxy resin such as transparent bis-phenol-A-glycidyl-ether or bis-phenol-F-glycidyl-ether may be used. In the silicone resin 22, a red fluorescent material (such as CaAlSiN$_4$ having europium (Eu) introduced therein) that absorbs and wavelength-converts at least part of the light emitted from the light emitting element 10, and emits the converted light is diffused. The fluorescent material is not limited to a red one, and it is also possible to use an yttrium/aluminum/garnet fluorescent material having cerium added thereto, a strontium silicate/barium fluorescent material having europium introduced therein, or an α-sialon fluorescent material Ca$_p$(Si, Al)$_{12}$(O,N)$_{16}$. The symbol (Si, Al) represents at least one of Si and Al, and the symbol (O,N) represents at least one of O and N. As for a red fluorescent material, La$_2$O$_2$S:Eu,Sm (the elements following ":" represents added elements, which also applies to the cases described later) or the like is used. As for a green fluorescent material, InGaN, BaMgAl$_{27}$O$_{17}$:Eu,Mn, or the like is used. Also, it is possible to diffuse a red fluorescent material and a green fluorescent material in the resin. Instead of a green fluorescent material or together with a green fluorescent material, a yellow fluorescent material may be used. For example, (Sr, Ca, Ba)$_2$SiO$_4$:Eu may be used. When a yellow fluorescent material is used, a red fluorescent material may be omitted, if necessary.

In this structure, part of the light emitted from the semiconductor light emitting element 10 is wavelength-converted by a fluorescent material, when passing through the sealing resin 22 having the fluorescent material diffused therein. White light with more excellent rendering properties can be obtained from the mixed color of the wavelength-converted light and the light that is not wavelength-converted and passes through the sealing resin 22.

As described above, in accordance with this embodiment, a light emitting device with excellent color rendering properties can be obtained without a highly controlled manufacturing technique.

Figure 16:
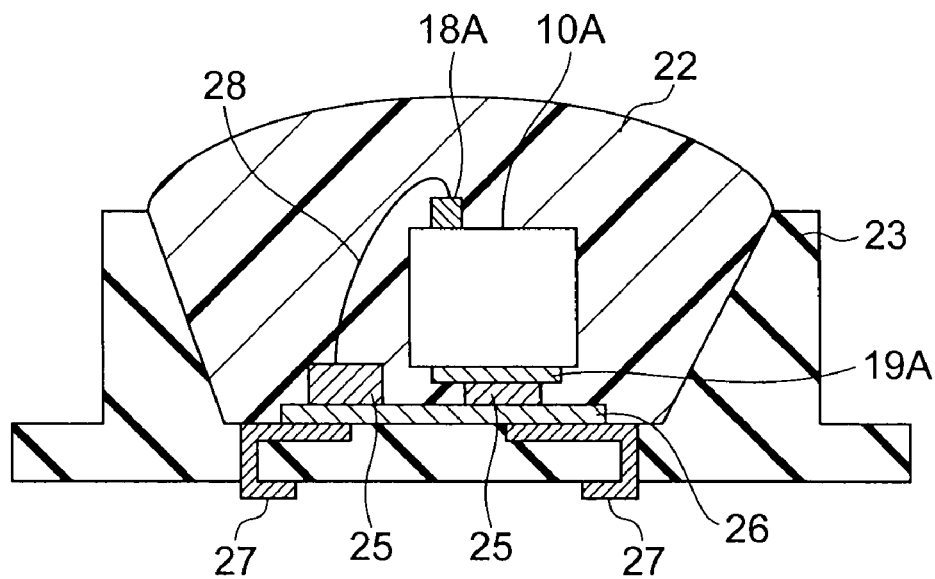
FIG. 16 is a cross-sectional view of a light emitting device according to a modification of the third embodiment.

In the light emitting device of this embodiment, the pair of electrodes 18 and 19 of the light emitting element are formed on the same side. However, as shown in FIG. 16, it is possible to use a light emitting element 10A that has electrodes 18A and 19A provided on the opposite sides from each other, for example. In such a case, the electrode 18A is electrically connected to a pad 25 via a wire 28. The n-side electrode 18A is in contact with an n-type GaN substrate. The positions of the n-side electrode 18A and the p-side electrode 19A may be switched upside down.

Fourth Embodiment

Figure 5:
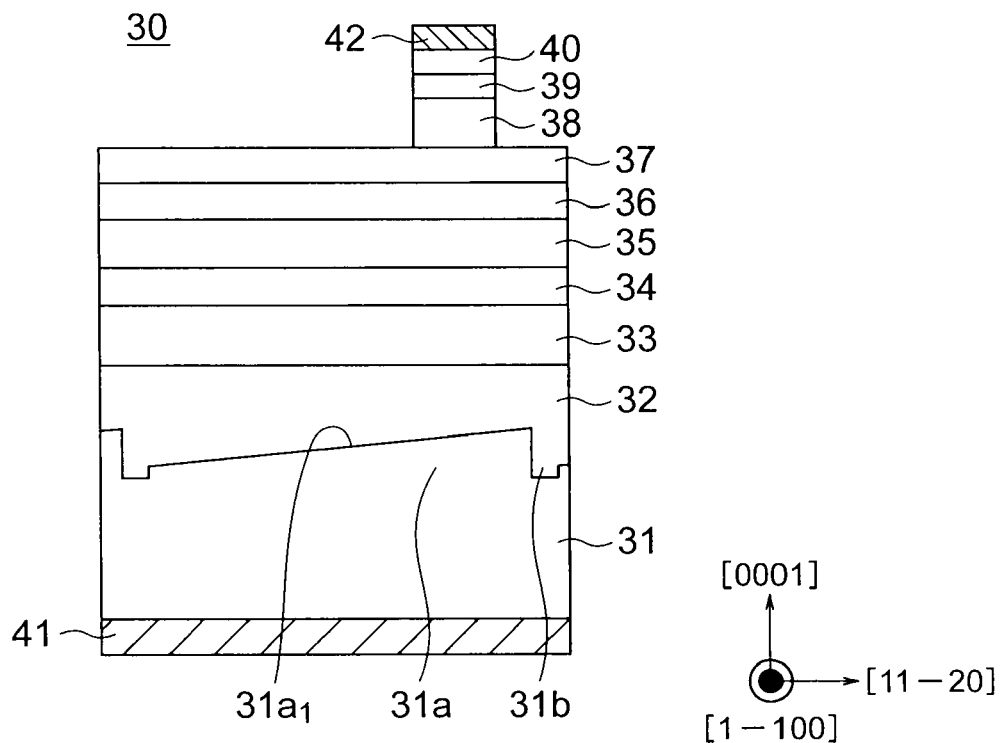
FIG. 5 is a cross-sectional view showing a semiconductor laser element according to a fourth embodiment.

FIG. 5 shows a semiconductor light emitting element in accordance with a fourth embodiment of the present invention. The light emitting element 30 of this embodiment is a nitride-based semiconductor laser element that has a stacked structure formed on a substrate 31 that is made of n-type GaN and has the same convex portions 31a and concave portions 31b as those of the first embodiment. The stacked structure includes an n-type GaN layer 32, a clad layer 33 made of n-type AlGaN, an optical guide layer 34 made of n-type GaN, an active layer 35 made of InGaN having a multiquantum well structure, an overflow preventing layer 36 made of p-type AlGaN, an optical guide layer 37 made of p-type GaN, a clad layer 38 made of p-type AlGaN, a p-type GaN layer 39, and a contact layer 40 made of p-type GaN. Those layers are stacked in this order. As in the case of the first embodiment, the surface of each convex portion 31a is a tilted surface 31a1 tilted with respect to the <11-20> direction (from the right-hand side to the left-hand side in the paper space). The widths of the convex portions 31a and the concave portions 31b are within the ranges described in the first embodiment. In this embodiment, the width of each convex portion 31a is 400 μm, and the width of each concave portion 31b is 30 μm.

In the above described stacked structure, an n-side electrode 41 is provided below the substrate 31. Also, a p-side electrode 42 having a ridge-like shape is provided to extend in a direction perpendicular to the paper space. The p-side electrode 42 has a 2-μm width in the <1-100> direction with respect to the higher right-hand side portion of the tilted surface 31a1 of each concave portion 31a of the substrate 31 or the region with a high In composition ratio. The ridge-like shape is formed by the clad layer 38 made of p-type AlGaN, the p-type GaN layer 39, the contact layer 40 made of p-type GaN, and the p-side electrode 42. The ridge-like shape limits the amount of current.

Next, the method for manufacturing the semiconductor laser element 30 of this embodiment is described. The semiconductor laser element 30 of this embodiment was manufactured by the well-known metal organic chemical vapor deposition (MOCVD) method. Trimethylgallium (TMG), trimethylaluminum (TMA), trimethylindium (TMI), and bis-cyclopentadienyl magnesium (Cp$_2$Mg) were used, and ammonia (NH$_3$) and silane (SiH$_4$) were used as raw material gases. Further, hydrogen and nitrogen were used as carrier gases. By the method for manufacturing the semiconductor laser element of this embodiment, the manufacturing device and the raw materials are not limited to those described below.

First, the substrate 31 made of n-type GaN having the convex portions 31a and the concave portions 31b formed on the surface was subjected to organic cleaning and acid cleaning, and was placed in the reaction chamber of a MOCVD device. The substrate 31 was then placed on a susceptor that was heated by high frequency waves. At normal pressures, nitrogen was introduced at a flow rate of 41 L/min, and ammonia was introduced at a flow rate of 4 L/min. Vapor phase etching was then performed while the temperature rose to 1100° C. in 12 minutes, and the natural oxide film formed on the surface of the substrate 31 was removed.

The n-type GaN layer 32 was then formed by supplying the carrier gases for 60 minutes: hydrogen at a flow rate of 6 L/min, nitrogen at a flow rate of 18 L/min, ammonia at a flow rate of 6 L/min, TMG at a flow rate of 50 cc/min, and SiH$_4$ at a flow rate of 5 cc/min.

The temperature was then lowered to 1060° C. The flow rate of hydrogen as a carrier gas was reduced to 21 L/min, the flow rate of nitrogen as a carrier gas was reduced to 20 L/min, and the flow rate of ammonia as a carrier gas was reduced to 4 L/min. The supply of TMG at a flow rate of 25 cc/min, TMA at a flow rate of 5 cc/min, and SiH$_4$ at a flow rate of 5 cc/min was carried out for 120 minutes, so as to form the clad layer 33 made of n-type AlGaN. The supply of TMA was then stopped, and only the flow rate of SiH$_4$ was reduced to 3 cc/min, so that the optical guide layer 34 made of n-type GaN was formed in approximately 10 minutes.

The supply of TMG and SiH$_4$ was then stopped, and the temperature of the substrate 11 was lowered to 800° C. The carrier gas was limited only to nitrogen at a flow rate of 27 L/min. Ammonia was then introduced at a flow rate of 12 L/min, and TMG was introduced at a flow rate of 3 cc/min. Also, TMI was supplied at a flow rate of 5 cc/min and a flow rate of 195 cc/min. The former flow rate lasted for approximately 16 minutes, and the latter flow rate lasted for approximately 2 minutes. The two flow rates were repeatedly switched, so that each of the two flow rates was used three times. TMI was then supplied at a flow rate of 5 cc/min for approximately 120 minutes, so as to form the active layer 35 made of InGaN having a multiquantum well structure.

The supply of TMG and TMI was then stopped. Meanwhile, the supply of nitrogen and ammonia was continued, and the nitrogen and ammonia were heated to 1030° C.

The temperature was maintained at 1030° C. The flow rate of hydrogen was switched to 21 L/min, the flow rate of nitrogen was switched to 20 L/min, and the flow rate of ammonia was switched to 4 L/min. Also, TMG was supplied at a flow rate of 25 cc/min, TMA was supplied at a flow rate of approximately 30 cc/min, and Cp$_2$Mg was supplied at a flow rate of 6 cc/min for approximately one minute, so as to form the overflow preventing layer 36 made of p-type AlGaN.

Only the supply of TMA was then stopped, and the supply of the other materials (hydrogen, nitrogen, ammonia, TMG, and $Cp_2Mg$) was continued at the same flow rates as above for approximately 2 minutes. As a result, the optical guide layer 37 made of p-type GaN was formed.

The supply of TMA was then resumed at a flow rate of 15 cc/min, and the flow rate of $Cp_2Mg$ was switched to 8 cc/min. The supply of $Cp_2Mg$ was then continued for approximately 40 minutes, so as to form the clad layer 38 made of p-type AlGaN.

Only the supply of TMA was then stopped, and the supply of the other materials (hydrogen, nitrogen, ammonia, TMG, and $Cp_2Mg$) was continued at the same flow rates as above for approximately 2 minutes. As a result, the p-type GaN layer 39 was formed. Further, the flow rate of $Cp_2Mg$ was switched to 50 cc/min, and $Cp_2Mg$ was supplied for approximately one minute, so as to form the contact layer 40 made of p-type GaN.

The supply of the organic metal material was then stopped, and only the supply of the carrier gas was continued, so that the temperature of the substrate 31 naturally dropped. The supply of ammonia was stopped when the temperature of the substrate 31 dropped to 500° C.

The semiconductor laser structure manufactured in the above described manner was retrieved from the MOCVD device. By removing stripe-like parts of the semiconductor laser structure by a well-known dry etching technique until the removing reached the clad layer 38 made of p-type AlGaN, a ridge was formed to have a 2-μm width in the [1-100] direction with respect to the higher right-hand side portion of the tilted surface of each concave portion 31a of the substrate 31 or the region with a high In composition ratio. The p-side electrode 42 formed with Ni/Au was then formed on the contact layer 40 made of p-type GaN on the exposed ridge.

The n-side electrode 41 formed with Ti/Pt/Au was then formed on the bottom face of the substrate 31 made of n-type GaN by a well-known vacuum vapor deposition technique or a well-known sputtering technique. The materials that can be used for those electrodes are not limited to those described above.

With the use of a scriber or the like, this laser structure was then cut along a direction parallel to the [11-20] direction from the substrate side, so as to form a resonant mirror. A dielectric film made of $SiO_2$ and $TiO_2$ was deposited on the resonant mirror by the electron beam deposition method or the like, so as to form a dielectric multilayer reflection film. The dielectric materials to form the dielectric multilayer reflection film are not limited to $SiO_2$ and $TiO_2$.

The semiconductor laser element manufactured in the above described manner continuously oscillated with a wavelength 440 nm. Here, the threshold current of the semiconductor laser element was 290 mA, the operating voltage was 7 V, and the optical output was 30 mW.

As described above, in accordance with this embodiment, the formation of point defects due to uneven In compositions and an increase of impurities that do not contribute to light emission are restrained by the concave and convex portions formed on the substrate. At the same time, a region with a high In composition ratio can be formed in the same plane. Thus, a long-wave nitride-based semiconductor laser element having an active layer with high crystal quality can be produced.

Fifth Embodiment

Next, a semiconductor light emitting element in accordance with a fifth embodiment of the present invention is described.

The semiconductor light emitting element of this embodiment is designed to reduce the absorption in the light emitting layer so as to increase the light emission efficiency. The semiconductor light emitting element then prevents a decrease in light emission efficiency caused by the reflection light passing through the light emitting layer in the light emitting element, so as to increase the light emission efficiency. More specifically, the semiconductor light emitting element causes internal reflection at a certain rate according to the refractive index difference between the inside and the outside of the element, and the light returning to the light emitting layer is absorbed in the light emitting layer. Due to this phenomenon, in a regular rectangular light emitting element, 50% or more of the light emitted from the light emitting layer cannot be taken out of the element. To counter this problem, the internal reflection is reduced so as to decrease the light absorption, and the amount of light to be taken out of the element is increased. However, TO further increase the efficiency, it is necessary to prevent the light absorption by the light emitting layer. In this embodiment, the light emitted from the light emitting layer is prevented from being absorbed back into the light emitting layer, and the light emission efficiency is increased.

Figure 6:
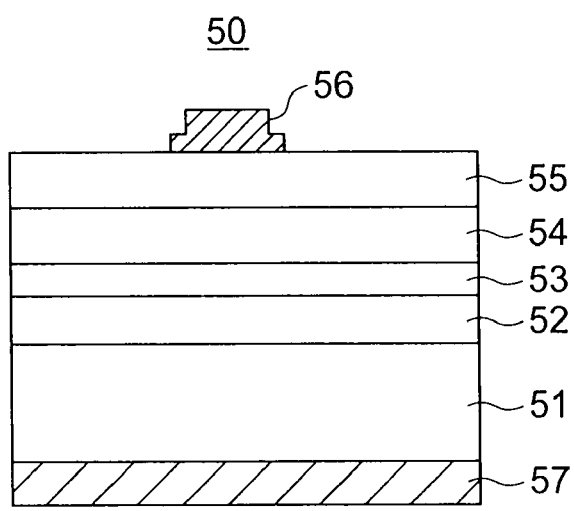
FIG. 6 is a cross-sectional view showing a semiconductor light emitting element according to a fifth embodiment.

FIG. 6 shows the semiconductor light emitting element in accordance with this embodiment. The semiconductor light emitting element 50 of this embodiment has a stacked structure formed on a substrate 51 made of n-type GaN. The stacked structure includes a hole enclosing layer (clad layer) 52 made of n-type $Al_{0.02}Ga_{0.98}N$, an active layer 53 made of $In_{0.2}Ga_{0.8}N/In_{0.03}Ga_{0.87}Al_{0.1}N$ having a multiquantum well structure, an electron enclosing layer (clad layer) 54 made of p-type $Al_{0.02}Ga_{0.98}N$, and a contact layer 55 made of p-type GaN. Those layers of the stacked structure are stacked in this order. A p-side transparent electrode 56 is provided on the contact layer 55, and an n-side electrode 57 is provided on the bottom face (the surface on the opposite side from the side on which the clad layer 52 is provided) of the substrate 51. The active layer 53 has a stacked structure in which a barrier layer that is made of $In_{0.03}Ga_{0.87}Al_{0.1}N$ and has a film thickness of 2 nm, a well layer (a well) that is made of $In_{0.2}Ga_{0.8}N$ and has a film thickness of 1.5 nm, and a barrier layer (a barrier) that is made of $In_{0.03}Ga_{0.87}Al_{0.1}N$ and has a film thickness of 2 nm are alternately stacked in this order. The stacked structure includes 20 stacked well layers (wells) in total.

In this embodiment, the stacked structure having the clad layer 52, the active layer 53, the clad layer 54, and the contact layer 55 stacked in this order on the substrate 51 was formed in a crystal stacking device by MOCVD.

The above described stacked structure was retrieved from the crystal stacking device. With the use of a metal mask having an opening of 250 μm×250 μm, Pt as the material for the p-side electrode was deposited, so as to form a Pt layer of the p-side transparent electrode 56. A $SiO_2$ film was then formed on the Pt layer, and a resist pattern formed with a photoresist having a rectangular opening of 200 μm×200 μm in size, which is smaller than the film area of the Pt layer, was formed on the $SiO_2$ film. With the resist pattern serving as a mask, the portion of the $SiO_2$ film corresponding to the above opening was removed with ammonium fluoride, and the Pt layer was exposed through the bottom face of the opening. Further, with the use of the resist pattern, a stack film of Ti/Pt/Au was formed in the opening by a lift-off technique, so as to form the p-side electrode 56. After the bottom face of the substrate 51 was polished, a stack film of Ti/Pt/Au was formed on the bottom face by a vapor deposition technique, and the n-side electrode 57 was formed.

First scribe lines were then formed on the surface of the substrate 51 made of n-type GaN. The first scribe lines were drawn along the elements, and were formed while the surface of the contact layer 55 made of p-type GaN was observed, so that the scribing avoided the p-side electrode 56. A second scribe lines that were perpendicular to the first scribe lines were then formed. This second scribe line were also formed while the surface of the contact layer 55 made of p-type GaN was observed, so that device isolation avoided the p-side electrode 56. Cutting was performed along the first and second scribe lines, so that individual chips were obtained.

Figure 7:
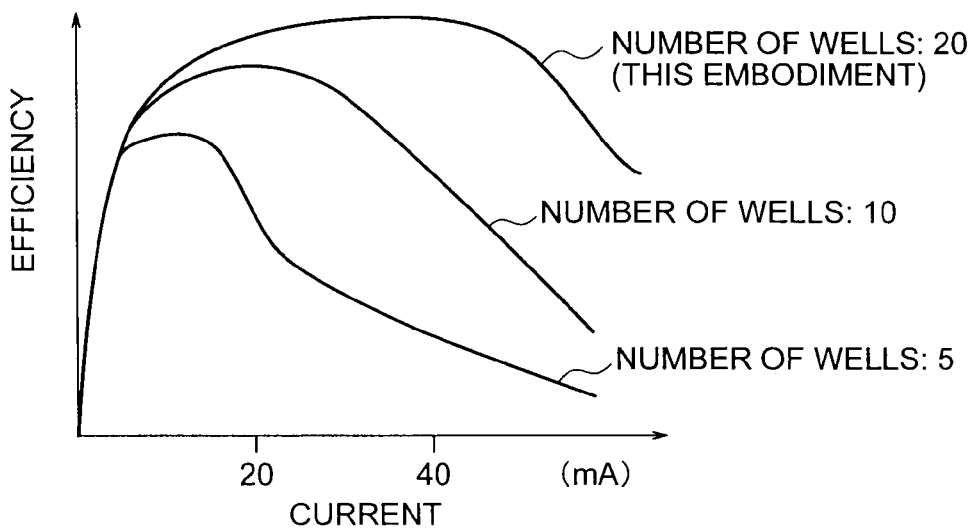
FIG. 7 shows the light emission efficiency-injection current characteristics that are observed in a case where the number of well layers is varied.

By the above described manufacturing method, a light emitting element having ten well layers (wells) and a light emitting element having five well layers (wells) were produced. The light emission efficiencies of the light emitting element of this embodiment having 20 wells, the light emitting element having ten wells, and the light emitting element having five wells were measured. Each of the light emitting element having ten well layers and the light emitting element having five well layers has the same structure as the light emitting element of this embodiment, except for the total number of well layers. FIG. 7 shows the measurement results. As can be seen from FIG. 7, the light emission efficiency of each of the light emitting element having five well layers and the light emitting element having ten well layers becomes lower as the injection current is increased. Accordingly, it is preferable that the total number of well layers is 20 or larger.

Figure 8:
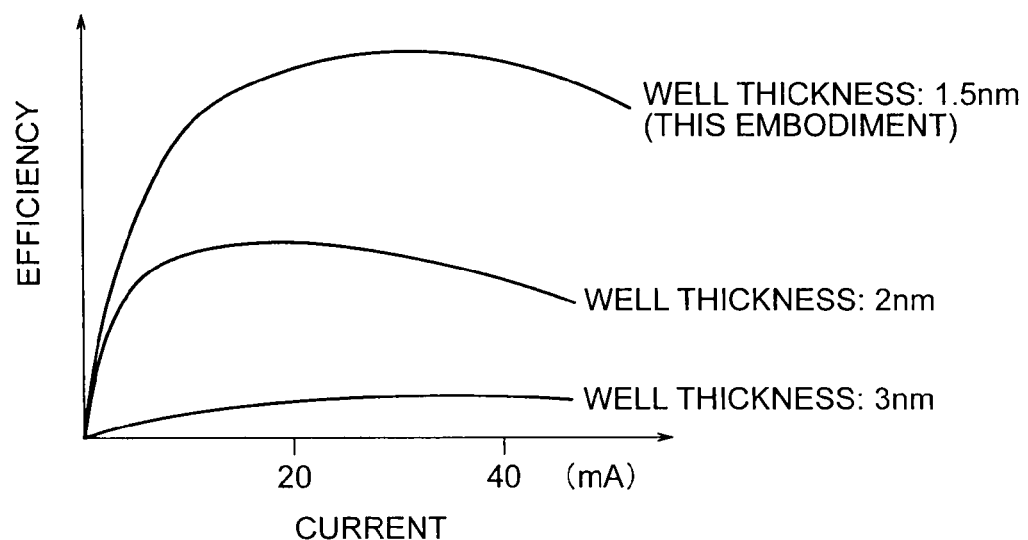
FIG. 8 shows the light emission efficiency-injection current characteristics that are observed in a case where the film thicknesses of the well layers are varied.

Next, a light emitting element having well layers of 2 nm in film thickness (well thickness) and a light emitting element having well layers of 3 nm in film thickness (well thickness) were manufactured, with the number of well layer being invariable. The light emission efficiency of each of the light emitting elements was measured. Each of those light emitting elements has the same structure as the light emitting element of this embodiment, except for the film thickness of each well layer. FIG. 8 shows the measurement results. As can be seen from FIG. 8, when the film thickness of each well layer is larger than the film thickness of each well layer of this embodiment, the light emission efficiency becomes lower. Accordingly, it is preferable that the film thickness of each well layer is 1.5 nm or smaller.

Figure 9:
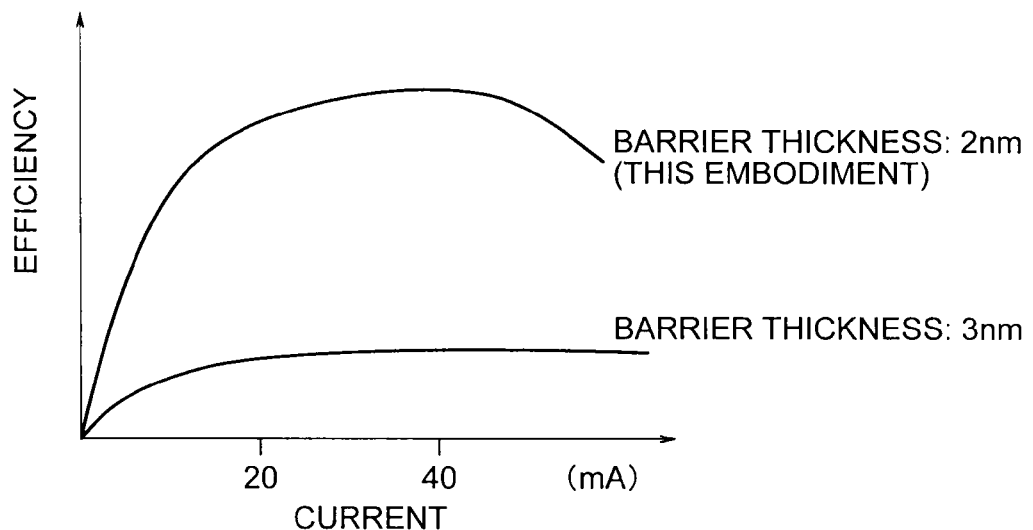
FIG. 9 shows the light emission efficiency-injection current characteristics that are observed in a case where the film thicknesses of the barrier layers are varied.

Also, a light emitting element having barrier layers (barriers) of 3 nm in film thickness (barrier thickness) was produced, with the number of well layers being invariable. The light emission efficiency of the light emitting element was measured. This light emitting element has the same structure as the light emitting element of this embodiment, except for the film thickness of each barrier layer. FIG. 9 shows the measurement results. As can be seen from FIG. 9, when the film thickness of each barrier layer is larger than the film thickness of each barrier layer of this embodiment, the light emission efficiency becomes lower. Accordingly, it is preferable that the film thickness of each barrier layer is 2 nm or smaller.

Figure 10:
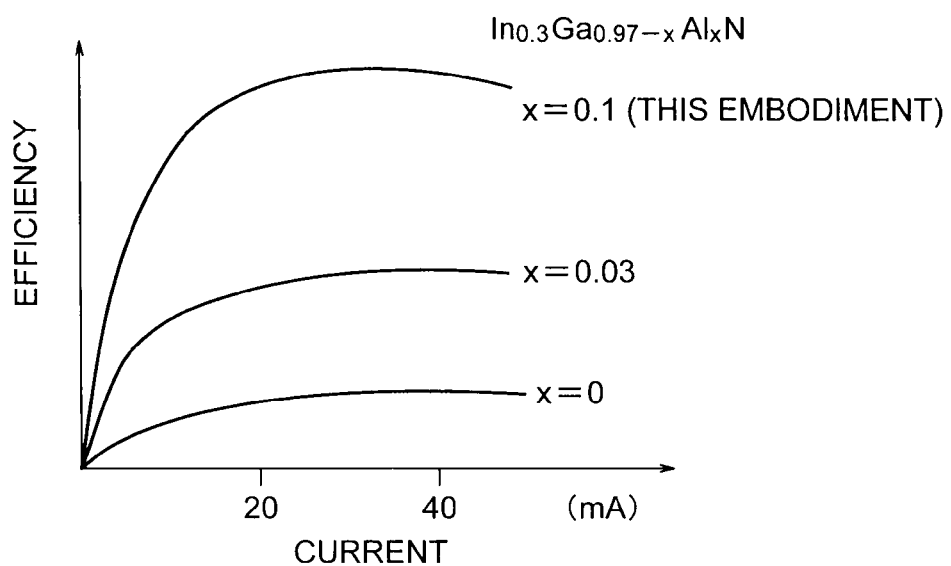
FIG. 10 shows the light emission efficiency-injection current characteristics that are observed in a case where the Al composition ratio is varied among the barrier layers.

In the light emitting element of this embodiment, the Al composition ratio of the barrier layers was 0.1. To vary the bandgap among the barrier layers, a light emitting element having barrier layers with an Al composition ratio of 0.03, and a light emitting element having barrier layers with an Al composition ratio of 0 were produced. FIG. 10 shows the results of measurement of the light emission efficiency with respect to current in each of the light emitting elements. As can be seen from FIG. 10, when the Al composition ratio in the barrier layers was reduced, the light emission intensity became lower. This is because a mini-band was formed in the multiquantum well layer as the bandgap difference between the well layers and the barrier layers disappeared, when the Al composition ratio in the barrier layers was reduced. Also, this is because the value of the refractive index became higher due to the decrease in Al composition ratio, and the rate at which light moved out of the active layer became lower. Therefore, to facilitate light retrieval from the active layer, it is essential that the refractive index of the barrier layers is lower than any other layer in the element.

In view of the above facts, the multiquantum well barrier layers of nitride semiconductors should have a larger bandgap than any other layer in the element, so that light can be effectively retrieved while the above described other effects are achieved.

In the nitride semiconductors used in this embodiment, the bandgap size tends to be inversely proportional to the refractive index. Therefore, it is not necessary to define both the refractive index and the bandgap, and the same effect can be achieved by defining the bandgap.

It has been known that the decrease in efficiency in a conventional LED is due to a temperature rise, and that light retrieving efficiency is reduced because the current paths are moved and gathered under the electrodes. However, in a GaN-based element, the efficiency becomes lower, even if a temperature rise is prevented by increasing the heat radiation, and the current paths are not located immediately below the electrodes. To prevent a decrease in efficiency, the number of multiquantum wells is increased, and the film thickness of each of the well layers and barrier layers is reduced so as to prevent an increase in voltage due to a large total thickness of the multiquantum wells. Also, since the mean refractive index of the multiquantum wells is lower than that of the surrounding layers, reflection of light emitted outward can be prevented between the active layer and the layer located outside of the active layer. Where the mean refractive index is lowered, it is not preferable that the refractive index of the well layers is reduced to vary the wavelengths. In this embodiment, however, it is important to increase the Al composition ratio in the barrier layers as in the embodiment.

As described above, in accordance with this embodiment, a highly-efficient light emitting element that can operate while the absorption by the light emitting layer is small can be obtained.

As in the first embodiment and the second embodiment, the concave and convex portions are formed on the substrate 51 of the light emitting element of this embodiment. Thus, as in the first embodiment and the second embodiment, a semiconductor light emitting element with excellent color rendering properties can be obtained without a highly controlled manufacturing technique.

Sixth Embodiment

Referring now to FIGS. 11 through 15, a light emitting device in accordance with a sixth embodiment of the present invention is described.

Figure 11:
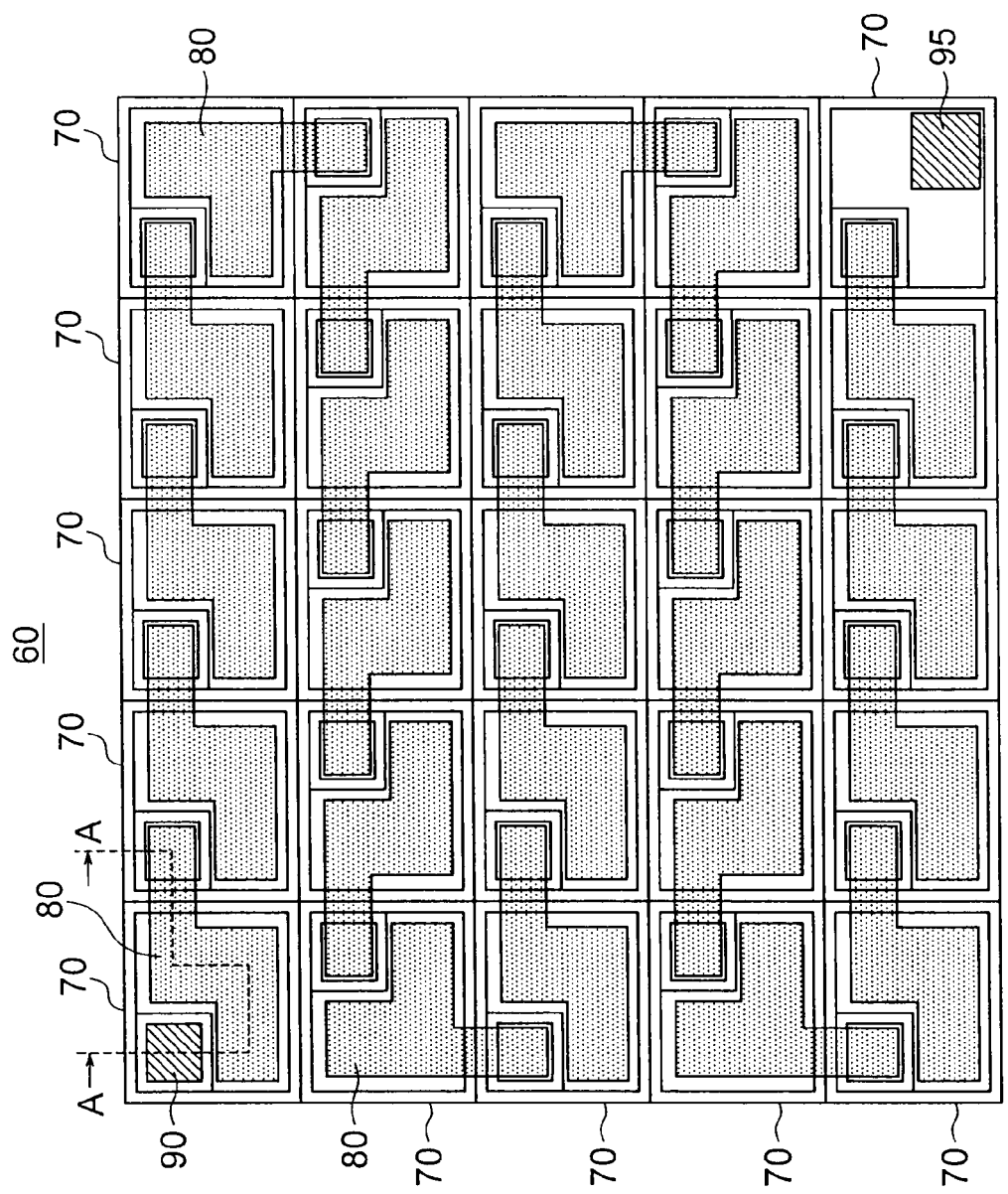
FIG. 11 is a plan view of a light emitting device according to a sixth embodiment.
Figure 12:
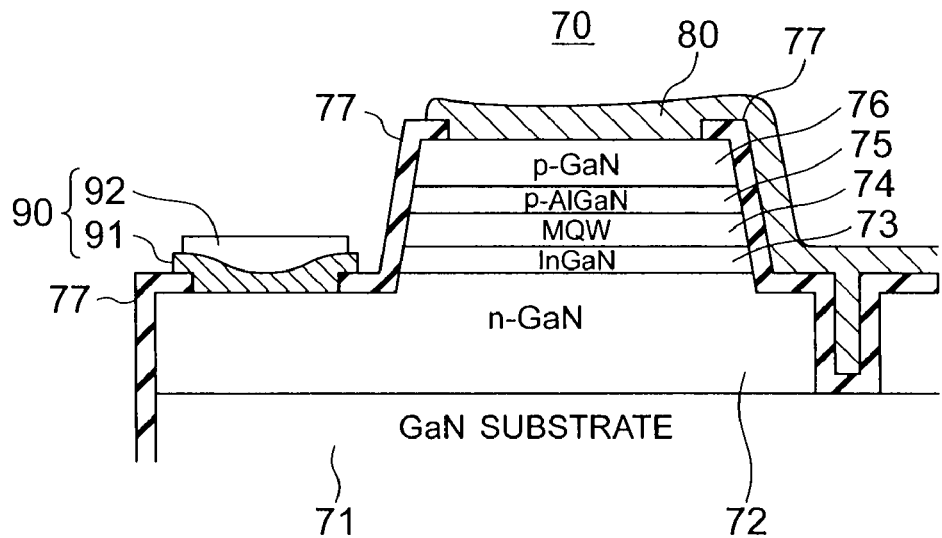
FIG. 12 is a cross-sectional view of a light emitting diode of the light emitting device according to the sixth embodiment.

FIG. 11 is a plan view of the light emitting device of this embodiment. The light emitting device 60 of this embodiment includes light emitting diodes 70 (25 LEDs in FIG. 11) arranged in a matrix form. As shown in FIG. 12, each of the light emitting diodes 70 has a stacked structure formed on a substrate 71 made of n-type GaN. The stacked structure includes a contact layer 72 made of n-type GaN, a base layer 73 made of InGaN, a light emitting layer 74 having a multi-quantum well structure, a cap layer 75 made of p-type AlGaN, and a contact layer 76 made of p-type GaN. A wire 80 is connected to the contact layer 76, so as to connect to the contact layer 72 of light emitting diodes 70. Accordingly, the light emitting diodes 70 arranged in a matrix form shown in FIG. 11 are connected in series by wires 80. As shown in FIG. 12, an insulating layer 77 made of $SiO_2$, for example, is provided to electrically insulate the cap layer 75, the light emitting layer 74, the base layer 73, and the contact layer 72 from the wire 80. Among the light emitting diodes 70 arranged in a matrix fashion as shown in FIG. 11, the light emitting diode 70 at the top left corner has a bonding pad 90 electrically connected to the n-type GaN contact layer 72. This bonding pad 90 is formed with a ZnO film 91 and a Ti/Pt/Au stacked film 92, as shown in FIG. 12. Among the light emitting diodes 70 arranged in a matrix fashion as shown in FIG. 11, the light emitting diode 70 at the bottom right corner has a bonding pad 95 electrically connected to the contact layer 76 made of p-type GaN. Like the bonding pad 90, the bonding pad 95 is formed with a ZnO film and a Ti/Pt/Au stacked film. In this embodiment, the wire 80 is made of a material having Ga added to ZnO. In the bonding pads 90 and 95, each ZnO film may contain Ga.

Next, a method for manufacturing the light emitting device of this embodiment is described.

First, in a crystal growth furnace, the contact layer 72 made of n-type GaN, the base layer 73 made of InGaN, the light emitting layer 74 of a multiquantum well structure, the cap layer 75 made of p-type AlGaN, and the contact layer 76 made of p-type GaN are stacked in this order on the substrate 71 made of n-type GaN. This stacked structure is retrieved from the crystal growth furnace, and a first resist pattern of a photoresist is formed on the contact layer 76. With the first resist pattern serving as a mask, etching is performed on part of the stacked structure, until the n-type GaN is exposed. After that, the first resist pattern is removed.

The surface of the stacked structure is cleaned, and the $SiO_2$ film 77 is formed on the entire surface by CVD. A second resist pattern having openings at the locations at which an n-side electrode and a p-side electrode are to be formed is formed on the $SiO_2$ film 77. With the second resist pattern serving as a mask, etching is performed on the $SiO_2$ film 77 with ammonium fluoride. After that, the second resist pattern is removed.

A resist is again applied, and the resist is patterned, so as to remain in the area outside the region on which ZnO is to be deposited. The stacked structure is then introduced into a laser MBE device, and ZnO is deposited. Here, Ga as an impurity is also deposited, and the sputter amount is adjusted so that the amount of Ga gradually becomes smaller.

When the deposition ends, the stacked structure is retrieved from the laser MBE device. The resist is removed, and lifting-off is performed so as to form wires made of ZnO having Ga added thereto. A third resist pattern is further formed, and a metal is deposited to cover the third resist pattern. The third resist pattern is then removed, so as to form the bonding pads 90 and 95 at both ends. The bonding pads 90 and 95 are preferably formed with Ti/Pt/Au, and more preferably, the Au layer should be thick.

Figure 13:
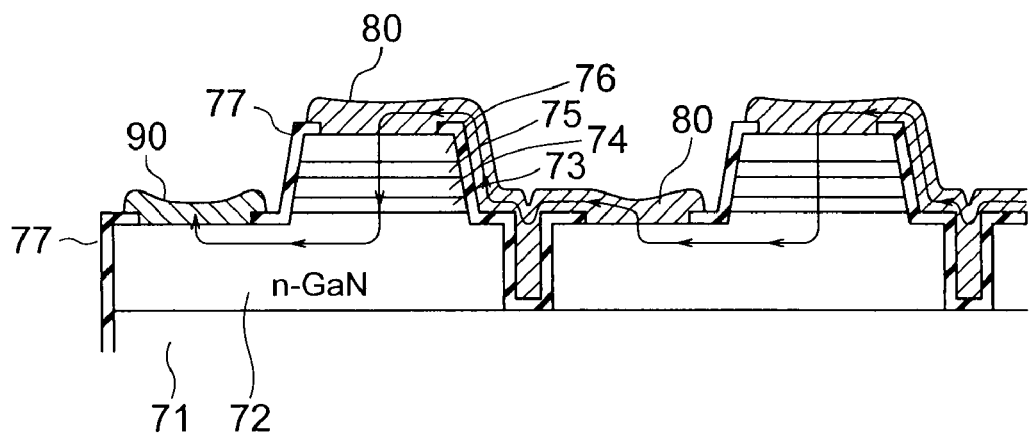
FIG. 13 is a cross-sectional view of the light emitting device, taken along the line A-A of FIG. 11.

FIG. 13 is a cross-sectional view of the light emitting device of this embodiment manufactured in the above described manner, taken along the line A-A of FIG. 11. In the light emitting device of this embodiment, a current flows as indicated by the arrows in FIG. 13. The light emitting diodes constituting the light emitting device of this embodiment operated with a direct current 100 V and 100 mA. Two of the light emitting diodes constituting the light emitting device of this embodiment were prepared and were connected in parallel so that the two light emitting diodes had the opposite polarities. When the two light emitting diodes were connected to an alternate current 100 V, the two light emitting diodes operated with 100 mA. If smoothing is carried out with a capacitor or a coil, more uniform light emission can be obtained.

Figure 14:
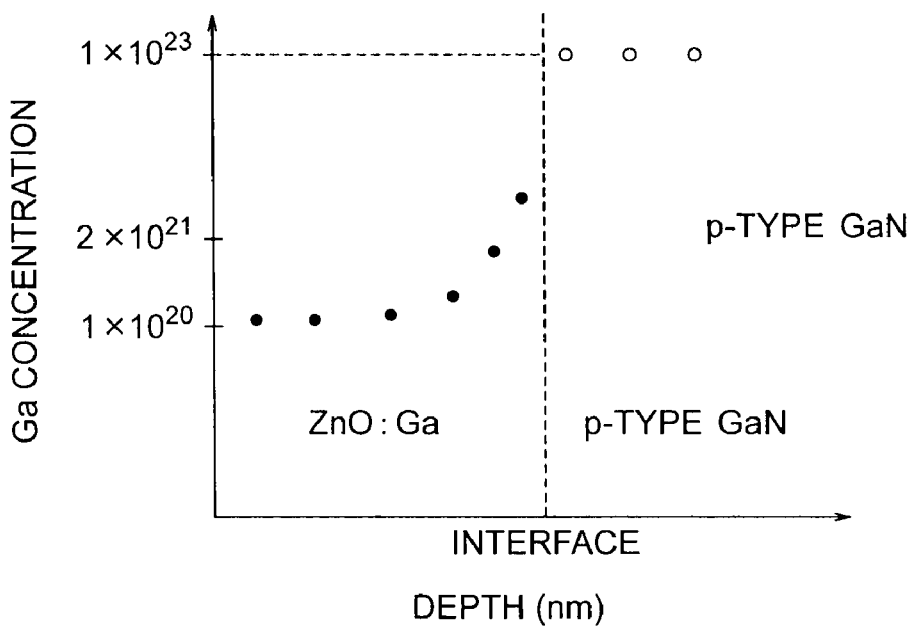
FIG. 14 shows the Ga concentration in the film thickness direction of the ZnO film serving as the wire line.

In this embodiment, the thickness of the ZnO film of each wire 80 is 500 nm, and such a profile that the concentration of Ga as the impurity becomes lower toward ZnO from the interface in contact with both the contact layer 76 made of p-type GaN and the contact layer 72 made of n-type GaN is observed. FIG. 14 shows the results of measurement of the profile by SIMS (Secondary Ion Mass Spectroscopy). The measurement by SIMS was carried out while sputtering was performed from the surface side. As can be seen from FIG. 14, the Ga concentration gradually becomes higher from the surface side, and becomes very high at the interface with the GaN contact layers. In the vicinity of the interface, the Ga concentration is higher than $1\times10^{21}$ cm$^{-3}$, and the portions in the vicinity of the interface are not semiconductors. At such portions, a so-called Mott transition is caused, and the portions exhibit the electric characteristics of a metal. If only the interface is doped with high-concentration Mg of approximately $2\times10^{21}$ cm$^{-3}$ in the p-type GaN contact layer 76 in contact with ZnO containing high-concentration Ga, the pn junction at the interface becomes opposite with respect to the current flow, but the interface maintains high concentration. As a result, tunneling is easily caused, and a junction can be formed at low resistance. Accordingly, even if the number of LEDs in the light emitting devices becomes larger, the contact resistance caused by connecting light emitting diodes to one another does not become higher. The thickness of the region containing the high-concentration Mg of approximately $2\times10^{21}$ cm$^{-3}$ in the contact layer 76 is preferably 10 nm or smaller. If the thickness is larger than 10 nm, defects are caused in the crystals, and the resistance becomes higher.

Although the substrate is a GaN substrate in this embodiment, a sapphire substrate or a Si substrate may be employed, instead of a GaN substrate. If a sapphire substrate or a Si substrate is employed, each element is detached from the substrate, and the light retrieving efficiency can be increased. In the case of a sapphire substrate, laser is emitted onto the sapphire, so as to detach the elements from the substrate. In the case of a Si substrate, the surface of each element is protected with a resin film, and the Si substrate is then removed with nitric hydrofluoric acid. In either case, after the detachment, the elements need to be attached to a supporting substrate and be held by the supporting substrate. At the time of the actual bonding to the supporting substrate, the light retrieving efficiency can be increased by forming the interface with a material having high reflectivity with respect to the emission wavelength.

Although laser MBE is used to form the ZnO films in this embodiment, it is also possible to form each ZnO film through aqueous growth. In such a case, patterning is performed with the use of a resist in the same manner as above, and gallium nitrate is solved in an aqueous zinc nitrate solution. Deposition is then performed at a water temperature of 100° C. The concentration is optimized, so as to form minute and uniform ZnO films. In this case, the Ga concentration in the ZnO films cannot be controlled in the thickness direction, and therefore, a concentration gradient cannot be generated toward the vicinity area of the interface. However, the resistance can be restricted to a low value by keeping the total Ga concentration high.

Other than that, MBE or a sputtering technique may be used to form the ZnO films, with a metal mask being used in place of a resist. Where MBE is used, ZnO film with high controllability and low resistance can be formed.

Figure 15:
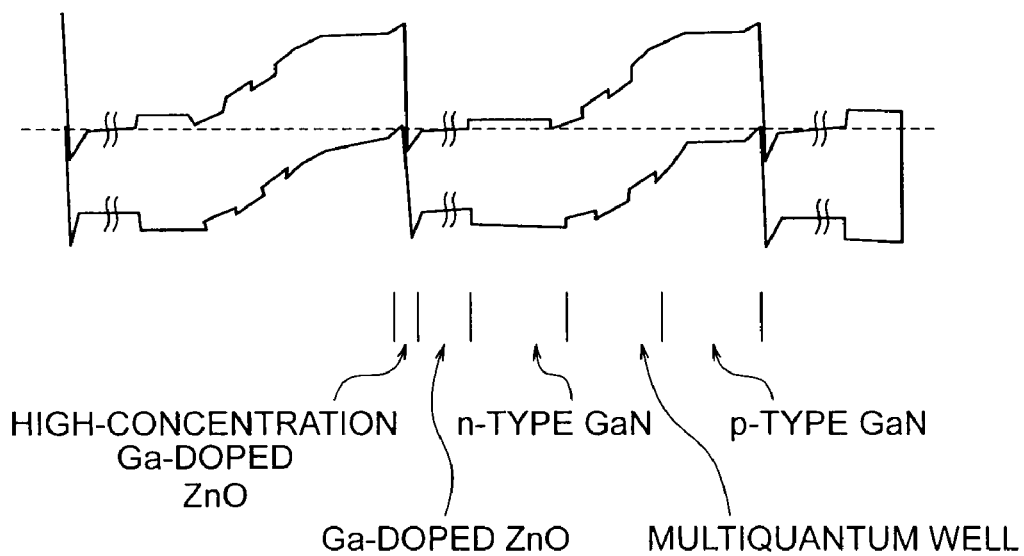
FIG. 15 is a schematic view showing the band lineup of the layer structure along the current flow in the sixth embodiment.

In this embodiment, the layer structure in the direction of current flow is formed with the p-type GaN contact layer, the n-type ZnO film, and the n-type GaN contact layer. FIG. 15 is a schematic view of the band lineup of this layer structure. As can be seen from FIG. 15, the junction between the p-type GaN contact layer and the n-type ZnO film is a tunnel junction, and resistance is hardly caused at this portion. In this manner, to optimize the effects of this embodiment, the oxide doping concentration should preferably be higher than the concentration with which a Mott transition is caused. More specifically, in the ZnO film, the doping concentration is $1 \times 10^{20}$ cm$^{-3}$. It is known that the equation, $n^{1/3} \times a = 0.26$, is established, where "n" represents the concentration with which a Mott transition is caused, and "a" represents the Bohr radius. In practice, however, behaviors of metals are observed when the concentration is ten times higher than the above.

In this embodiment, the portion in contact with the oxide serving as the wire is made of GaN. However, the portion may be made of a nitride semiconductor containing at least one of the III-group elements (Ga, In, Al, and B). Although the doping material for the oxide is Ga in this embodiment, it is possible to use In, Al, or B. Also, ZnO is used as the oxide serving as the wires in this embodiment, but a Mg oxide (MgO) may be used instead. This is because ZnO and MgO can be doped with high-concentration Ga. Since Ga is a constituent element of GaN, Ga is diffused in the interface with GaN, and high concentration can be expected.

It is possible to form the concave and convex portions of the first and second embodiments on the surface of the substrate 71 of each of the light emitting diodes 70 of this embodiment. In such a case, a semiconductor light emitting device having excellent color rendering properties as in the first and second embodiments can be obtained. Also, the light emitting diodes of this embodiment may be used as the light emitting elements of the third embodiment.

Seventh Embodiment

Next, a semiconductor light emitting element in accordance with a seventh embodiment of the present invention is described.

Generally, in a structure of a semiconductor light emitting element, the light emitting layer for enclosing carriers is made of a material having a smaller energy bandgap than a contact layer and a clad layer that are the layers surrounding the light emitting layer. In a regular material, the refractive index is inversely proportional to the size of the energy band gap. Therefore, a high refractive index is observed near the light emitting layer, and a low refractive index is observed in the surrounding layers. Of the light emitted from the light emitting layer in such a structure, the light traveling substantially in the horizontal direction is all reflected by the interface between the light emitting layer and the clad layer, and is then guided into the light emitting layer.

Figure 17:
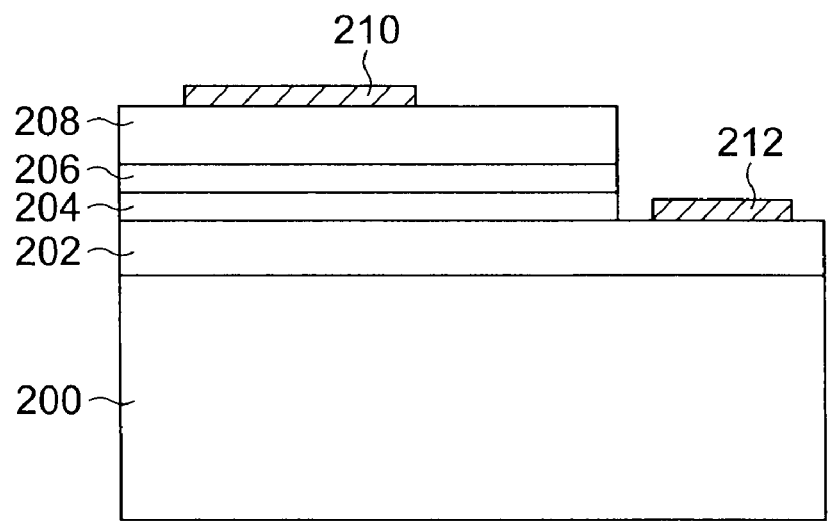
FIG. 17 is a cross-sectional view of a semiconductor light emitting element in accordance with a seventh embodiment.

In the semiconductor emitting element of this embodiment, on the other hand, the refractive index of the light emitting layer is smaller than the refractive index of the layers surrounding the light emitting layer, and the relationship in refractive index is the opposite of the relationship observed in a conventional structure. The quantity of light to be guided back into the light emitting layer is extremely small. The semiconductor light emitting element of this embodiment is a light emitting diode. FIG. 17 is a cross-sectional view of the light emitting diode. The light emitting diode of this embodiment includes: an n-type GaN substrate 200 having a film thickness of 150 μm; an n-type GaN layer 202 that is formed on the GaN substrate 200 and has a film thickness of 300 nm; an overflow preventing layer 204 that is formed on a first region of the GaN layer 202, has a 10-nm thick film for preventing holes from overflowing, and is made of n-type $Al_{0.1}Ga_{0.9}N$; a light emitting layer 206 that is formed on the overflow preventing layer 204 and has a multiquantum well structure having barrier layers and well layers alternately stacked therein; a contact layer 208 that is formed on the light emitting layer 206, is made of p-type GaN, and has a film thickness of 80 nm; a p-side electrode 210 that is provided on the contact layer 208; and an n-side electrode 212 that is formed on a region other than the first region in the GaN layer 202.

Figure 18:
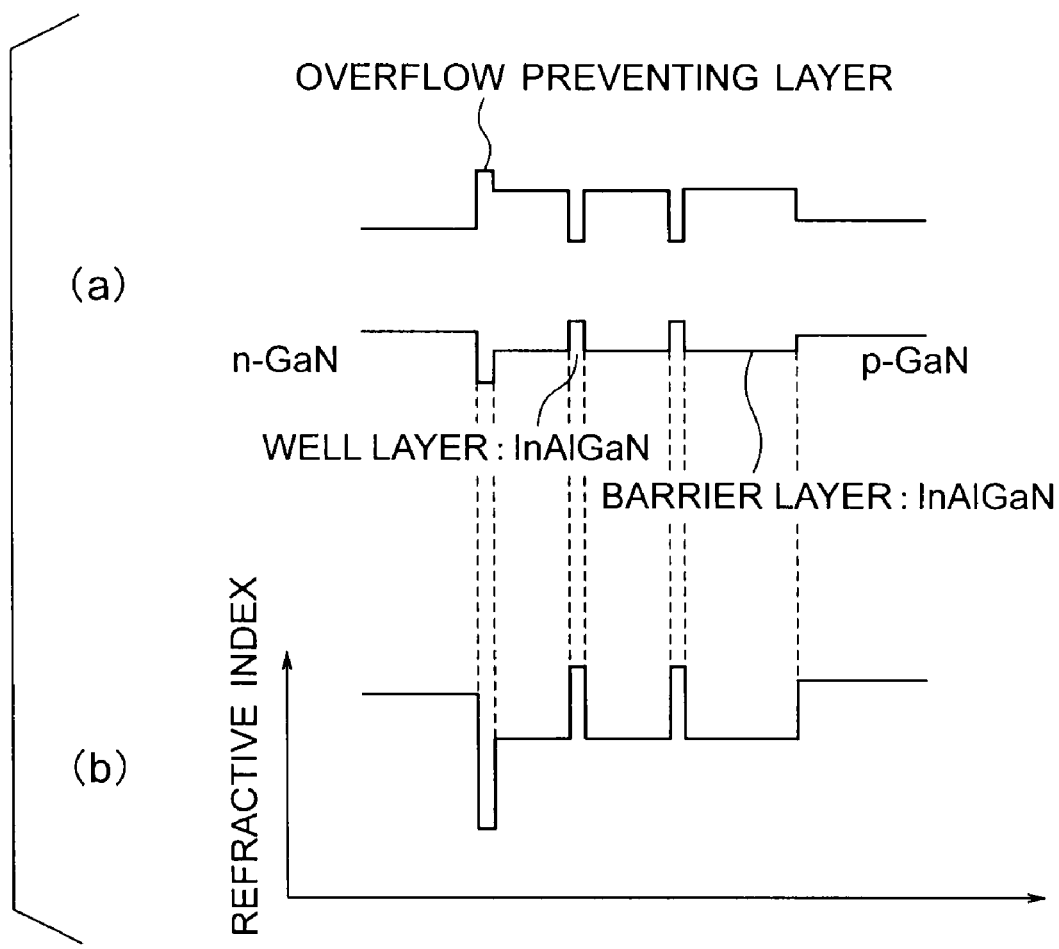
FIG. 18(a) shows the energy band of the semiconductor light emitting element according to the seventh embodiment.
FIG. 18(b) shows the refractive index of the semiconductor light emitting element according to the seventh embodiment.

Each of the barrier layers of the light emitting layer 206 is a 10-nm thick film of $In_{0.005}Al_{0.05}Ga_{0.945}N$, and each of the well layers of the light emitting layer 206 is a 2.5-nm thick film of $In_{0.15}Al_{0.005}Ga_{0.845}N$. FIG. 18(*a*) shows the energy band of the semiconductor light emitting element of this embodiment, and FIG. 18(*b*) shows the refractive index of the semiconductor light emitting element of this embodiment. As can be seen from FIGS. 18(*a*) and 18(*b*), in this embodiment, the mean refractive index of the barrier layers and the well layers is lower than the mean refractive index of the layers existing on and under the light emitting layer 206 (such as the overflow preventing layer 204, the n-type GaN layer 202, and the contact layer 208 made of p-type GaN). In this case, the mean refractive index of the barrier layers and the well layers is even lower than the mean refractive index of the n-type GaN substrate 200. In this specification, the mean refractive index Nave of a structure formed with m ($\geq 1$) layers is a mean refractive index weighted with the layer thickness. Accordingly, the mean refractive index Nave is a value expressed as:

$$\text{Nave} = (n_1 \cdot d_1 + \ldots + n_m \cdot d_m)/(d_1 + \ldots + d_m)$$

where $n_i$ represents the refractive index of the ith layer ($1 \leq I \leq m$), and $d_i$ represents the layer thickness of the ith layer.

Figure 19:
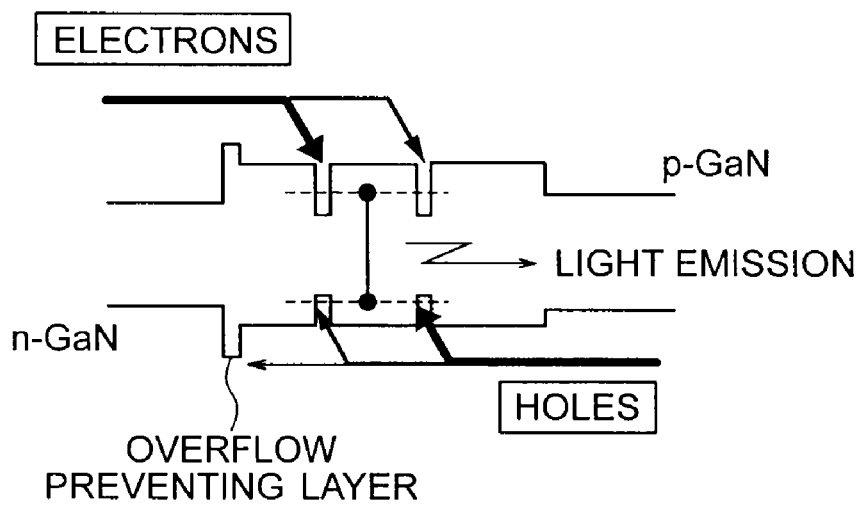
FIG. 19 illustrates the reason that an overflow preventing layer is provided on the n-side.

In a conventional structure, the hole effective mass is greater than the electron effective mass. Therefore, an invalid current flowing beyond the light emitting layer is caused by an electron overflow. In this embodiment, however, the light emitting layer is formed with barrier layers that are 10-nm thick films of $In_{0.005}Al_{0.05}Ga_{0.945}N$, and well layers that are 2.5-nm thick films of $In_{0.15}Al_{0.005}Ga_{0.845}N$. Since the barrier layers of the quantum well structure has a greater bandgap, holes flow over the light emitting layer and cause an invalid current, as indicated by the arrows in FIG. 19. This was found by the inventors of the present invention. To counter this problem, in this embodiment, the overflow preventing layer 204 is provided to prevent holes from overflowing toward the n-side, which is the opposite of a conventional case. In this manner, the light emission efficiency is increased. FIG. 19 shows the energy band of the semiconductor light emitting element of this embodiment. In FIG. 19, the broken lines represent the quantum level in the quantum well, and indicate that light is emitted when electrons and holes are recombined. In this embodiment, the overflow preventing layer is designed to have a larger bandgap than the barrier layers.

Figure 20:
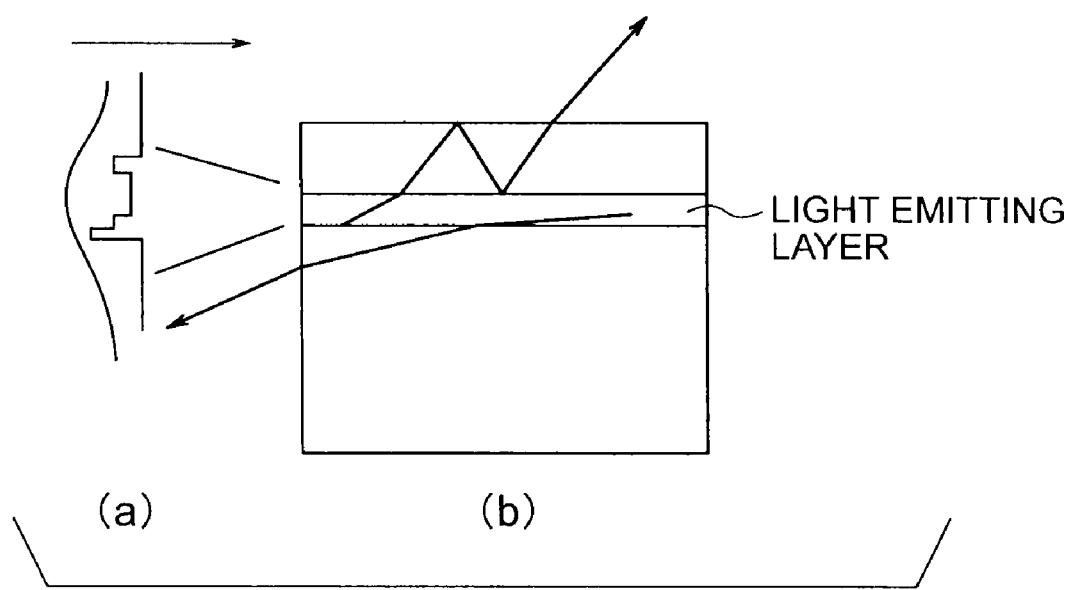
FIGS. 20(a) and 20(b) illustrate the effects of the seventh embodiment.

In this embodiment, the refractive index of the light emitting layer is lower than the refractive index of the layers around the light emitting layer, and the relationship in refractive index is the opposite of the conventional case, as shown in FIG. 20(a). Accordingly, as shown in FIG. 20(b), the amount of light to be guided back into the light emitting layer is extremely small, and the light reflected by the outermost periphery of the semiconductor light emitting element does not return to the light emitting layer, if the reflected light has a smaller angle than a certain angle. The reflected light is further reflected by an interface between the light emitting layer and a layer existing outside the light emitting layer, and is then guided to the outside. In this embodiment, the rate at which the emitted light returns to the light emitting layer is extremely low, and the amount of light that can be taken out of the semiconductor light emitting element is dramatically increased. In a conventional structure, on the other hand, the light emitted from the light emitting layer is reflected in all directions, and the light reflected toward the film plane returns to the light emitting layer. The returning light is then absorbed in the light emitting layer. As a result, the amount of light emitted and then taken out of the element is small with respect to the amount of injected current.

In this embodiment, a layer having a large energy bandgap for preventing electrons from overflowing may be provided on the p-side.

Also, it is possible to form the concave and convex portions of the first and second embodiments on the surface of the substrate 200 of the light emitting diode of this embodiment. In such a case, a semiconductor light emitting device having excellent color rendering properties as in the first and second embodiments can be obtained.

Also, the semiconductor light emitting element of this embodiment may be used as the light emitting elements of the third embodiment.

Also, the semiconductor light emitting element of this embodiment may be used in place of the light emitting diodes of the sixth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor light emitting element comprising:
   a semiconductor substrate that has at least one convex portion having only one tilted surface in one direction as an upper face, and at least one concave portion formed on either side of the convex portion, the concave portion having a smaller width than the convex portion, a bottom face of the concave portion being located in a deeper position than the upper face of the convex portion; and
   a light emitting layer that is made of a nitride-based semiconductor and is formed on the semiconductor substrate so as to cover at least the convex portion.

2. The element according to claim 1, wherein the light emitting layer has a multiquantum well structure formed with InGaN.

3. The element according to claim 2, wherein a first portion formed in a higher region of the tilted surface of the light emitting layer has a high In composition ratio than a second portion formed in a lower region of the tilted surface, the lower region having a lower height from the bottom face of the concave portion than that of the higher region.

4. The element according to claim 1, wherein the concave portion has a width in the range of 20 μm to 100 μm, and a depth in the range of 5 μm to 50 μm.

5. The element according to claim 1, wherein the convex portion has a width in the range of 200 μm to 1 mm, and the tilted surface has a tilt angle in the range of 0.1 to 45 degrees.

6. The element according to claim 5, wherein the tilt angle is in the range of 0.2 to 0.4 degrees.

7. The element according to claim 1, wherein:
   the semiconductor substrate is a GaN substrate;
   the tilted surface is tilted with respect to the <11-20> direction; and
   the light emitting layer is formed in the <1-100> direction of the semiconductor substrate.

8. The element according to claim 1, further comprising:
   an n-type GaN layer that is provided between the semiconductor substrate and the light emitting layer;
   a first guide layer that is provided between the n-type GaN layer and the light emitting layer, and is made of n-type GaN;
   an overflow preventing layer that is formed on the light emitting layer and is made of p-type AlGaN;
   a second guide layer that is formed on the overflow preventing layer and is made of p-type GaN; and
   a contact layer that is provided on the second guide layer and is made of p-type GaN.

9. The element according to claim 1, further comprising:
   an n-type GaN layer that is provided between the semiconductor substrate and the light emitting layer;
   a first clad layer that is provided between the n-type GaN layer and the light emitting layer, and is made of n-type AlGaN;
   a first guide layer that is provided between the first clad layer and the light emitting layer, and is made of n-type GaN;
   an overflow preventing layer that is formed on the light emitting layer and is made of p-type AlGaN;
   a second guide layer that is formed on the overflow preventing layer and is made of p-type GaN;
   a second clad layer that is formed on the second guide layer and is made of p-type AlGaN; and
   a contact layer that is provided on the second clad layer and is made of p-type GaN.

* * * * *